United States Patent
Jindo et al.

(10) Patent No.: US 9,120,383 B2
(45) Date of Patent: Sep. 1, 2015

(54) RECIPROCATING DEVICE

(75) Inventors: Takahiro Jindo, Chiryu (JP); Jun Suzuki, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 169 days.

(21) Appl. No.: 13/882,643

(22) PCT Filed: Oct. 4, 2011

(86) PCT No.: PCT/JP2011/072857
§ 371 (c)(1),
(2), (4) Date: Apr. 30, 2013

(87) PCT Pub. No.: WO2012/066862
PCT Pub. Date: May 24, 2012

(65) Prior Publication Data
US 2013/0220756 A1    Aug. 29, 2013

(30) Foreign Application Priority Data

Nov. 17, 2010    (JP) .................................. 2010-256767

(51) Int. Cl.
*B60L 5/00* (2006.01)
*B60L 13/03* (2006.01)
(Continued)

(52) U.S. Cl.
CPC ................. *B60L 5/005* (2013.01); *B60L 13/03* (2013.01); *B60M 7/003* (2013.01); *F16C 29/005* (2013.01); *F16C 29/008* (2013.01); *H02J 5/005* (2013.01); *B60M 7/00* (2013.01)

(58) Field of Classification Search
CPC ....... H02N 2/021; B60L 13/003; B60L 5/005; F16C 29/005; F16C 29/008; F16C 41/00; H05K 13/00
USPC .......................................................... 191/10
See application file for complete search history.

(56) References Cited

U.S. PATENT DOCUMENTS 5,949,681 A     9/1999  Asai et al.
7,119,877 B2 * 10/2006  Takita .............................. 355/53
(Continued)

FOREIGN PATENT DOCUMENTS

CN      1403355 A    3/2003
CN      1938933 A    3/2007
(Continued)

OTHER PUBLICATIONS

International Search Report Issued Jan. 31, 2012 in PCT/JP11/72857 Filed Oct. 4, 2011.
(Continued)

*Primary Examiner* — Zachary Kuhfuss
(74) *Attorney, Agent, or Firm* — Oblon, McClelland, Maier & Neustadt, L.L.P.

(57) ABSTRACT

In a reciprocating device, first and second power transmission units are provided on one end side and the other end side of a track to put therebetween power receiving units which are provided on a movable body being movable along the track. Thus, when the movable body is moved close to the one end side or the other end side of the track to separate the power receiving units far from the second power transmission unit on the other end side or the first power transmission unit on the one end side, the power receiving units are able to efficiently receive the electric power from the first power transmission unit on the one end side or the second power transmission unit on the other end side which is close thereto. Therefore, it is possible to reciprocate the movable body between the both ends of the track in a simplified construction.

8 Claims, 5 Drawing Sheets

(51) Int. Cl.
*F16C 29/00* (2006.01)
*H02J 5/00* (2006.01)
*B60M 7/00* (2006.01)

(56) References Cited

U.S. PATENT DOCUMENTS

| | | | | |
|---|---|---|---|---|
| 7,832,534 | B2* | 11/2010 | Hahn et al. | 191/10 |
| 2005/0128449 | A1* | 6/2005 | Phillips | 355/53 |
| 2006/0208058 | A1* | 9/2006 | Kodama et al. | 235/376 |
| 2007/0069666 | A1* | 3/2007 | Van Eijk et al. | 318/135 |
| 2010/0031856 | A1* | 2/2010 | Shoda et al. | 108/21 |
| 2010/0148085 | A1 | 6/2010 | Yoshida et al. | |
| 2010/0229377 | A1* | 9/2010 | Jindo et al. | 29/709 |

FOREIGN PATENT DOCUMENTS

| | | |
|---|---|---|
| CN | 101326706 A | 12/2008 |
| JP | 09-093838 | 4/1997 |
| JP | 9 252193 | 9/1997 |
| JP | 2002 337574 | 11/2001 |
| JP | 2004-241929 | 8/2004 |
| JP | 2008-274590 | 11/2008 |
| JP | 2010 13009 | 1/2010 |
| JP | 2010 68657 | 3/2010 |
| JP | 2010-156515 | 7/2010 |
| WO | 2007 063693 | 6/2007 |

OTHER PUBLICATIONS

Office Action issued Feb. 27, 2015 in Chinese Patent Application No. 201180054293.6.

Japanese Office Action issued in Application No. 2014-140156 on Jun. 30, 2015 (w/ English Translation).

* cited by examiner

RECIPROCATING DEVICE

TECHNICAL FIELD

The present invention relates to a reciprocating device that receives electric power transmitted by a wireless power supply and that reciprocates a movable body along a track by the electric power.

BACKGROUND ART

For example, Patent Document 1 discloses a reciprocating device (traveling vehicle system) wherein a movable body (traveling vehicle) receives electric power transmitted by a wireless power supply and is reciprocated by the electric power along a track (rail for the traveling). The reciprocating device is constructed so that the movable body is reciprocated along the track by having electric power supplied wirelessly from a pair of feeders (power transmission unit) arranged along the track to a power receiving unit (power receiving pickup) provided on the movable body.

Further, Patent Document 2 discloses a wireless power transmitting device that receives electric power transmitted by a wireless power supply through a resonance phenomenon and that charges a battery of a movable body (electric car) with the electric power. The wireless electric power transmitting device is constructed so that the transmission efficiency of electric power is improved by making the resonance frequency of resonance coils and the frequency of an alternating-current power coincide with each other.

PRIOR ART DOCUMENTS

Patent Documents

Patent Document 1: JP 2010-13009 A (paragraph 0006 and FIG. 5)
Patent Document 2: JP 2010-68657 A (paragraph 0007 and FIG. 1)

SUMMARY OF THE INVENTION

Problem to be Solved by the Invention

In the reciprocating device described in the foregoing Patent Document 1, it is necessary to arrange the pair of feeders as power transmission unit along the track without affecting the power supply, and thus, it is liable to complicate the construction, to make the construction work laborious and to increase the cost. Further, in the wireless power transmitting device described in Patent Document 2, although it is possible to charge the battery of the movable body held in a stationary state by supplying electric power thereto, it is impossible to move the movable body while supplying electric power to the battery being in an uncharged state.

The present invention has been made taking the foregoing circumstances into consideration, and an object thereof is to provide a reciprocating device that receives electric power transmitted by a wireless power supply simplified in construction and that reciprocates a movable body along a track by the electric power.

Solution to the Problem

In order to solve the foregoing problems, the invention according to a first aspect comprises a track; a movable body provided reciprocatably on the track; moving means for moving the movable body; movement control means for drivingly controlling the moving means; electric power control means for controlling the output of electric power for movement of the movable body; a first power transmission unit connected to the electric power control means and provided on one end side of the track; a second power transmission unit connected to the electric power control means and provided on the other end side of the track; and a power receiving unit connected to the movement control means and provided on the movable body; wherein electric power supplied from the electric power control means to at least one of the first power transmission unit and the second power transmission unit is transmitted wirelessly to the power receiving unit to be received by the power receiving unit and wherein the received electric power is supplied to the movement control means whereby the moving means is drivingly controlled to reciprocate the movable body along the track.

The invention according to a second aspect resides in that in the first aspect, the power receiving unit comprises a first power receiving unit being able to receive the electric power transmitted from the first power transmission unit and a second power receiving unit being able to receive the electric power transmitted from the second power transmission unit.

The invention according to a third aspect resides in that in the second aspect, the first power receiving unit is provided on the movable body to face the first power transmission unit and that the second power receiving unit is provided on the movable body to face the second power transmission unit.

The invention according to a fourth aspect resides in that in any one of the first to third aspects the transmission/receiving of the electric power is performed through magnetic field resonance or electric field resonance.

The invention according to a fifth aspect resides in that in any one of the first to third aspects, the transmission/receiving of the electric power is performed through electromagnetic induction.

The invention according to a sixth aspect resides in that in any one of the first to fifth aspects, the movable body is at least one of a component mounting head and a slide that mounts the component mounting head movably and that moves the component mounting head, in a component mounting machine for mounting components on a board transferred and positioned, and that the track is a rail that guides the movement of at least one of the component mounting head and the slide.

The invention according to a seventh aspect resides in that in any one of the first to sixth aspects, the electric power control means controls a power sum of the electric power transmitted and received from the first power transmission unit and the electric power transmitted and received from the second power transmission unit to become constant irrespective of changes in the distance between the first power transmission unit and the power receiving unit and the distance between the second power transmission unit and the power receiving unit.

The invention according to an eighth aspect resides in that in the seventh aspect, when the distance between one of the first power transmission unit and the second power transmission unit and the power receiving unit becomes equal to or less than a predetermined value, the electric power control means cuts off the power supply to the other of the first power transmission unit and the second power transmission unit.

Effects of the Invention

According to the invention in the first aspect, the first power transmission unit and the second power transmission unit are provided on the one end side and the other end side of the track to put therebetween the power receiving unit which is provided on the movable body being movable along the track. Therefore, when the movable body is moved close to the one end side or the other end side of the track to separate the power receiving unit far from the second power transmission unit on the other end side or the first power transmission unit on one end side, the power receiving unit is able to efficiently receive electric power wirelessly from the first power transmission unit on the one end side or the second power transmission unit on the other end side. Thus, it is possible to reciprocate the movable body between the both ends of the track in a simplified construction.

According to the invention in the second aspect, two of the first receiving unit and the second power receiving unit are provided as the power receiving unit, wherein the first power receiving unit receives the electric power transmitted from the first power transmission unit and the second power receiving unit receives the electric power transmitted from the second power transmission unit. Therefore, it is possible to move the movable body by a reduced power by controlling the ratio of the electric powers transmitted from the first power transmission unit and the second power transmission unit, in harmony with the movement of the movable body between the both ends of the track.

According to the invention in the third aspect, since the first power receiving unit and the second power receiving unit are provided to respectively face the first power transmission unit and the second power transmission unit, the first power receiving unit and the second power receiving unit can efficiently receive the electric powers transmitted respectively from the first power transmission unit and the second power transmission unit.

According to the invention in the fourth aspect, since the movable body is moved by the wireless power supply through the magnetic field resonance or the electric filed resonance, it is possible to transmit/receive electric power efficiently even if the distance between the transmission and receiving units is relatively long.

According to the invention in the fifth aspect, since the movable body is moved by the wireless power supply through the electromagnetic induction, the construction becomes simplified in comparison with that by the wireless power supply through magnetic field resonance or electric filed resonance, and hence, a reduction can be realized in cost.

According to the invention in the sixth aspect, since the reciprocating device is applied to the component mounting head, the slide and the rail in the component mounting machine, there become unnecessary cables, cable bearers and the like that have been required in the prior art for the supply of electric power to moving means such as component mounting head and the like. In the prior art, it may be the case that cables are broken at the time of a high speed movement of a component mounting head or the like, and an energy loss takes place due to the dead load and the bending stress of the cable bearer. According to the present invention, because cables and cable bearers become unnecessary, these problems can be solved. Further, in the prior art, because an increase in the moving speed of a component mounting head or the like causes cable bearers to flutter and hence, results in deteriorating the positioning accuracy of the component mounting head as well as in generating errors in operation, restrictions are imposed on speeding up the component mounting head or the like. According to the present invention, because cable bearers become unnecessary, it can be realized to speed up the component mounting head or the like in comparison with the prior art. Further, because cables, cable bearers and the like become unnecessary, it can be realized to save the space for the component mounting machine.

According to the invention in the seventh aspect, since even if the movable body takes any position between the both ends of the track, the power sum of the electric power transmitted and received from the first power transmission unit and the electric power transmitted and received from second power transmission unit is controlled to become constant, it is possible to reciprocate the movable body stably between the both ends of the track.

According to the invention in the eighth aspect, when the movable body is close to one of the first power transmission unit and the second power transmission unit, the electric power supply to the other of the first power transmission unit and the second power transmission unit is cut off and the power sum can be controlled to become constant, it is possible to realize an energy saving without supplying excessive electric power.

EMBODIMENT FOR PRACTICING THE INVENTION

Figure 1:
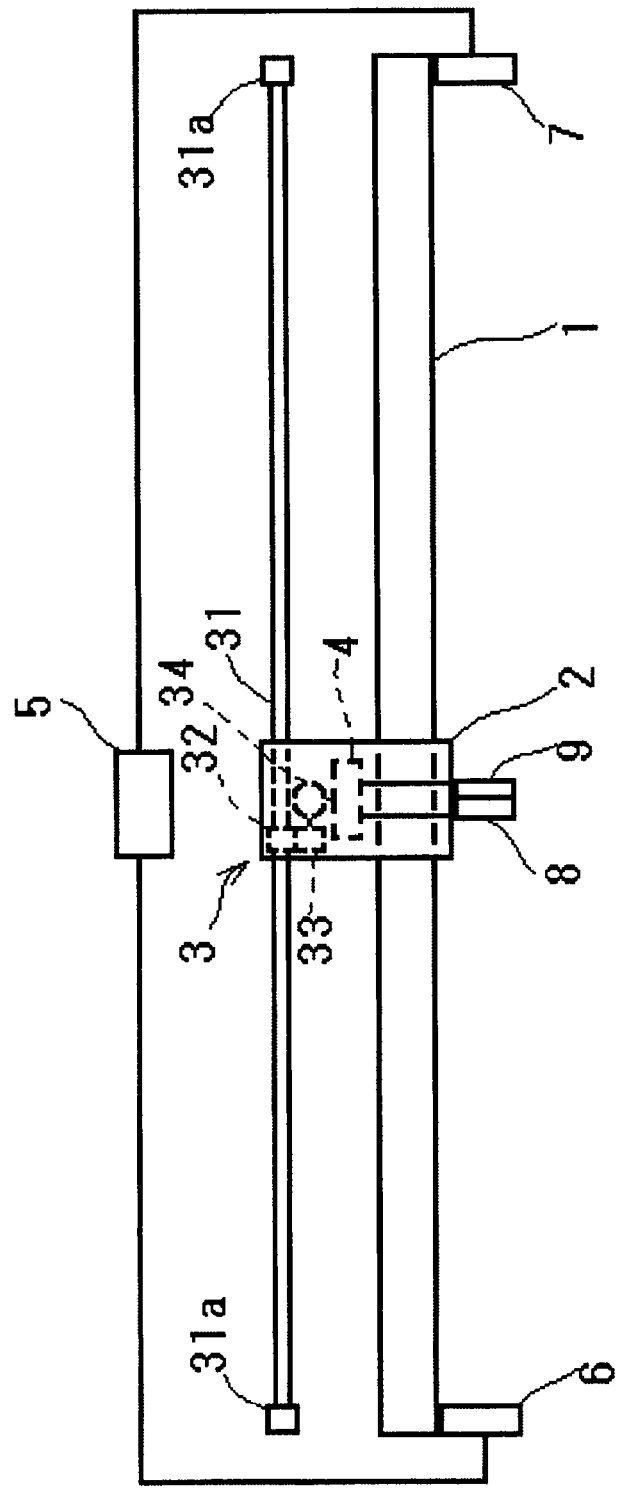
FIG. 1 is a schematic construction view showing one embodiment of a reciprocating device according to the present invention.

Hereinafter, an embodiment of a reciprocating device in the present invention will be described with reference to the drawings. As shown in FIG. 1, the reciprocating device is provided with a track 1, a movable body 2 provided reciprocatably on the track 1, moving mean 3 for moving the movable body 2, movement control means 4 for drivingly controlling the moving means 3, and electric power control means 5 for controlling the output of the electric power for movement of the movable body 2. Further, the reciprocating device is provided with a first power transmission unit 6 connected to the electric power control means 5 and provided on one end side (left end side in the figure) of the track 1, a second power transmission unit 7 connected to the electric power control means 5 and provided on the other end side (right end side in the figure) of the track 1, a first power receiving unit 8 connected to the movement control means 4 and provided on the movable body 2 to face the first power transmission unit 6, and a second power receiving unit 9 connected to the movement control means 4 and provided on the movable body 2 to face the second power receiving unit 9. The reciprocating device is a device that receives the electric power transmitted by a wireless power supply and that reciprocates the movable body 2 along the track 1 by the electric power.

The track 1 takes form of a straight rodlike shape and is supported to be fixed on fixed walls (not shown) at opposite ends thereof. The movable body 2 takes a boxlike shape and is arranged movably along the track 1. The moving means 3 is provided with a ball screw 31, a ball nut 32, a gear mechanism 33 and a motor 34. The ball screw 31 is machined to the almost same length as that of the track 1, is arranged in parallel to the track 1 and is supported to be secured to support portions 31a at opposite ends thereof. The ball nut 32 is screw-engaged with the ball screw 31 and is rotatably supported in the movable body 2. The gear mechanism 33 is rotatably supported in the movable body 2 with a rotational connection made between a rotational shaft of the motor 34 and the ball nut 32 so that the ball nut 32 is rotatable by the driving of the motor 34 secured to the movable body 2.

The movement control means 4 is wired to the first power receiving unit 8 and the second power receiving unit 9 and is constructed to be able to input the electric powers from the first and second power receiving units 8, 9. The movement control means 4 is wired to the motor 34 and is constructed to be able to control the rotational speed of the motor 34 in positive and negative-going directions. The electric power control means 5 is wired to the first power transmission unit 6 and the second power transmission unit 7 and is constructed to be able to control, by current for example, the outputs of the electric powers supplied to the first power transmission unit 6 and the second power transmission unit 7.

The first power transmission unit 6 is secured to the fixed wall (not shown) on the one end side of the track 1 and is wired to the electric power control means 5. The first power receiving unit 8 is secured to the movable body 2 to face the first power transmission unit 6 and is wired to the movement control means 4. The second power transmission unit 7 is secured to the fixed wall (not shown) on the other side of the track 1 and is wired to the electric power control means 5. The second power receiving unit 9 is secured to the movable body 2 to face the second power transmission unit 7 and is wired to the movement control means 4. The first power receiving unit 8 and the second power receiving unit 9 are secured to the movable body 2 with surfaces opposite to power receiving surfaces joined together to be isolated electrically and magnetically. Between the first power transmission unit 6 and the first power receiving unit 8 and between the second power transmission unit 7 and the second power receiving unit 9, respective wireless power supplies can be done through, for example, magnetic field resonance, electric field resonance or electromagnetic induction.

In the present embodiment, in order that the first power receiving unit 8 and the second power receiving unit 9 efficiently receive the electric powers transmitted from the first power transmission unit 6 and the second power transmission unit 7, the construction is taken that the first power transmission unit 6 and the first power receiving unit 8 are arranged to face each other and that the second power transmission unit 7 and the second power receiving unit 9 are arranged to face each other. However, the wireless power supplies are possible without taking the face-to-face arrangements. Thus, it is possible to enhance the flexibility in the layouts of the power transmission and receiving units. Further, although the construction is taken that two power receiving units including the first power receiving unit 8 and the second power receiving unit 9 respectively receive the electric powers transmitted from the first power transmission unit 6 and the second power transmission 7, there can be taken a construction that one power receiving unit receives the electric powers transmitted respectively from the first power transmission unit 6 and the second power transmission unit 7. Thus, it is possible to realize a reduction in cost.

The first power transmission unit 6 and the first power receiving unit 8 take the same construction as the second power transmission unit 7 and the second power receiving unit 9, and the construction in the case that magnetic field resonance is applied will be described with reference to FIG. 2. The first power transmission unit 6 (the second power transmission unit 7) is provided with a primary coil 61 (71) and a primary antenna 62 (72) arranged in close vicinity to the primary coil 61 (71), and the first power receiving unit 8 (the second power receiving unit 9) is provided with a secondary coil 81 (91) and a secondary antenna 82 (92) arranged in close vicinity to the secondary coil 81 (91). Further, the primary coil 61 (71) is wired to the electric power control means 5, while the secondary coil 81 (91) is wired to the movement control means 4. The primary antenna 62 (72) and the secondary antenna 82 (92) are adjusted to resonate at the same resonance frequency.

In this structure, when primary current is outputted from the electric power control means 5 to the primary coil 61 (71), electromagnetic induction takes place to pass induced current through the primary antenna 62 (72) and further, the primary antenna 62 (72) resonates at a resonance frequency $\omega S(=1/\sqrt{(Ls \cdot Cs)})$ due to the inductance Ls and stray capacitance Cs of the primary antenna 62 (72). Then, the secondary antenna 82 (92) provided to face the primary antenna 62 (72) resonates at the resonance frequency $\omega s$ and further, secondary current passes through the secondary antenna 82 (92). Then, electromagnetic induction takes place to pass secondary current through the secondary coil 81 (91), and the secondary current is supplied to the movement control means 4. With the aforementioned operation, it is possible to wirelessly supply the electric power from the first power transmission unit 6 (the second power transmission unit 7) to the first power receiving unit 8 (the second power receiving unit 9).

Next, the operation of the reciprocating device will be described. In order to reciprocate the movable body 2 stably along the track 1, the electric power control means 5 suffices to perform a control that a power sum of the electric power transmitted from the first power transmission unit 6 to be received by the first power receiving unit 8 and the electric power transmitted from the second power transmission unit 7 to be received by the second power receiving unit 9 becomes constant irrespective of changes in the distance between the first power transmission unit 6 and the first power receiving unit 8 and the distance between the second power transmission unit 7 and the second power receiving unit 9.

Figure 3:
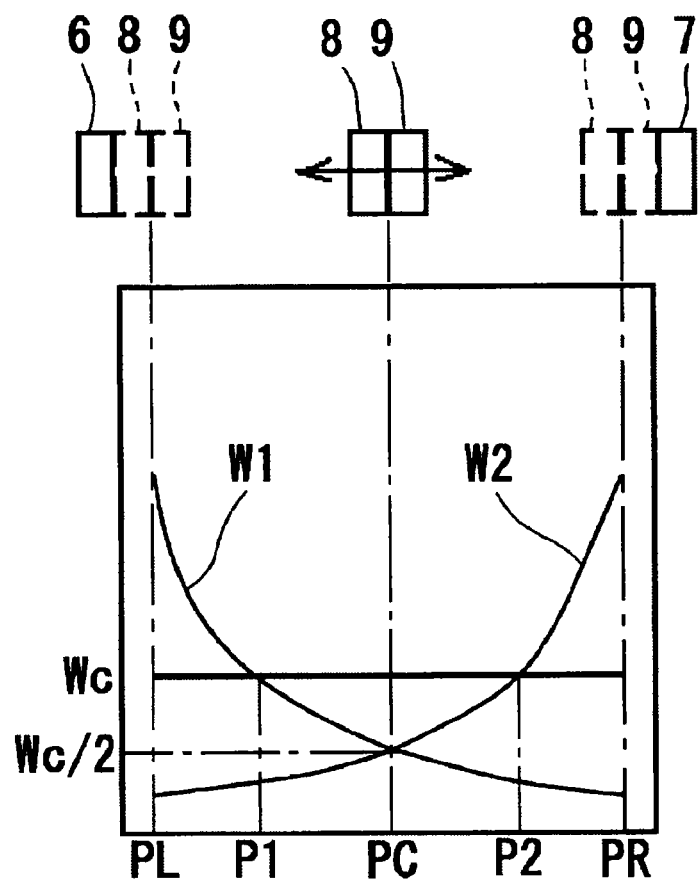
FIG. 3 is a chart showing the changes in the electric powers received by power receiving units when a movable body in the reciprocating device in FIG. 1 reciprocates on a track.

As shown in FIG. 3, where a fixed electric power W is transmitted from the first power transmission unit 6 and the second power transmission unit 7 when the movable body 2 is moved along the track 1 from one end position PL to the other end position PR, an electric power W1 transmitted from the first power transmission unit 6 and received by the first power receiving unit 8 gradually decreases as the first power receiving unit 8 goes away from the first power transmission unit 6, while an electric power W2 transmitted from the second power transmission unit 7 and received by the second power receiving unit 9 gradually increases as the second power receiving unit 9 comes close to the second power transmission unit 7. On the other hand, where the fixed electric power W is transmitted from the first power transmission unit 6 and the second power transmission unit 7 when the movable body 2 is moved along the track 1 from the other end position PR to the one end position PL, the electric power W2 transmitted from the second power transmission unit 7 and received by the second power receiving unit 9 gradually decreases as the second power receiving unit 9 goes away from the second power transmission unit 7, while the electric power W1 transmitted from the first power transmission unit 6 and received by the first power receiving unit 8 gradually increases as the first power receiving unit 8 comes close to the first power transmission unit 6.

That is, the change of the electric power W1 received by the first power receiving unit 8 and the change of the electric power W2 received by the second power receiving unit 9 take a symmetrical shape with the center at a center position PC along the track 1. Therefore, a power Wc being the sum of the electric power Wc/2 received by the first power receiving unit 8 and the electric power Wc/2 received by the second power receiving unit 9 when the movable body 2 (the joining surface between the first power receiving unit 8 and the second power receiving unit 9) is positioned to the center position PC along the track 1 is set as a controlled electric power of a predetermined value controlled by the electric power control means 5. As a result, the movement control means 4 is able to reciprocate the movable body 2 stably along the track 1.

Regarding a specific control method for the electric power control means 5, while the movable body 2 (the joining surface between the first power receiving unit 8 and the second power receiving unit 9) starts the movement from the left end position PL toward the right end position PR along the track 1 and reaches a position P1 where the electric power W1 received by the first power receiving unit 8 becomes Wc, the electric power control means 5 cuts off the electric power to be supplied to the second power transmission unit 7 and controls the electric power supply to the first power transmission unit 6 so that the electric power W1 received by the first power receiving unit 8 becomes Wc.

Then, while the movable body 2 moves to the center position PC beyond the position P1, the electric power control means 5 turns on the electric power supplied to the second power transmission unit 7 and controls the electric power supply to the second power receiving unit 9 so that the electric power W2 received by the second power receiving unit 9 becomes the difference electric power between the controlled electric power Wc and the electric power W1 received by the first power receiving unit 8. At this time, the electric power supplied to the first power receiving unit 8 may instead be controlled so that the electric power W1 received by the first power receiving unit 8 becomes the difference electric power between the controlled power Wc and the electric power W2 received by the second power receiving unit 9.

Then, while the movable body 2 goes over the center position PC and reaches a position P2 where the electric power W2 received by the second power receiving unit 9 becomes Wc, the electric power control means 5 controls the electric power supply to the first power transmission unit 6 so that the electric power W1 received by the first power receiving unit 8 becomes the difference electric power between the controlled electric power Wc and the electric power W2 received by the second power receiving unit 9. At this time, the electric power supply to the second power receiving unit 9 may instead be controlled so that the electric power W2 received by the second power receiving unit 9 becomes the difference electric power between the controlled electric power Wc and the electric power W1 received by the first power receiving unit 8.

Then, while the movable body 2 moves to the right end position PR beyond the position P2, the power control means 5 turns off the electric power supplied to the first power transmission unit 6 and controls the electric power supply to the second power transmission unit 7 so that the electric power W2 received by the second power receiving unit 9 becomes Wc. As mentioned above, when the distance between the first power transmission unit 6 and the first power receiving unit 8 becomes equal to or less than a predetermined valve, that is, when the movable body 2 is moved toward the left end position PL beyond the position P1, the electric power control means 5 cuts off the power supply to the second power transmission unit 7 and controls the power supply to the first power transmission unit. Thus, the control can be performed efficiently so that the electric power W1 received by the first power receiving unit 8 becomes the controlled power Wc being constant. Likewise, when the distance between the second power transmission unit 7 and the second power receiving unit 9 becomes equal to or less than the predetermined value, that is, when the movable body 2 is moved toward the right end position PR beyond the position P2, the electric power control means 5 cuts off the power supply to the first power transmission unit 6 and controls the power supply to the second power transmission unit 7. Thus, the control can be performed efficiently so that the electric power W2 received by the second power receiving unit 9 becomes the controlled power Wc being constant. Accordingly, it is possible to reciprocate the movable body 2 stably between the both ends of the track 1 and to realize the energy saving without supplying an excessive electric power.

According to the reciprocating device in the foregoing embodiment, the first power transmission unit 6 and the second power transmission unit 7 are provided on one end side and the other end side of the track 1 to put therebetween the first power receiving unit 8 and the second power receiving unit 9 which are provided on the movable body 2 being movable along the track 1. Therefore, when the movable body 2 is moved close to the one end side or the other end side of the track 1 to separate the second power receiving unit 9 or the first power receiving unit 8 far from the second power transmission unit 7 on the other end side or the first power transmission unit 6 on the one end side, the first power receiving unit 8 or the second power receiving unit 9 is able to efficiently receive the electric power from the first power transmission unit 6 on the one end side or the second power transmission unit 7 on the other end side which is close thereto. Therefore, it is possible to reciprocate the movable body 2 between the both ends of the track 1 in a simplified construction.

In particular, two of the first power receiving unit 8 and the second power receiving unit 9 are provided as power receiving unit, wherein the first power receiving unit 8 receives the electric power transmitted from the first power transmission unit 6 and wherein the second power receiving unit 9 receives the electric power transmitted from the second power transmission unit 7. Thus, it is possible to move the movable body 2 with a reduced electric power by controlling the ratio of the electric powers, transmitted from the first power transmission unit 6 and the second power transmission unit 7, in harmony with the movement of the movable body 2 between the both ends of the track 1. Further, since the first power receiving unit 8 and the second power receiving unit 9 are provided to respectively face the first power transmission unit 6 and the second power transmission unit 7, the first power receiving unit 8 and the second power receiving unit 9 can efficiently receive the electric powers transmitted from the first power transmission unit 6 and the second power transmission unit 7 respectively. Further, since the movable body 2 is moved by the electric power supplied wirelessly through the magnetic field resonance or the electric field resonance, it is possible to transmit and receive the electric power efficiently even if the distance between the power transmission and receiving units is comparatively long. Further, where the movable body 2 is moved by the electric power supplied wirelessly through the electromagnetic induction, the construction becomes simple in comparison with the wireless power supply which is performed through magnetic field resonance or electric field resonance, and hence, a reduction can be realized in cost.

Figure 4:
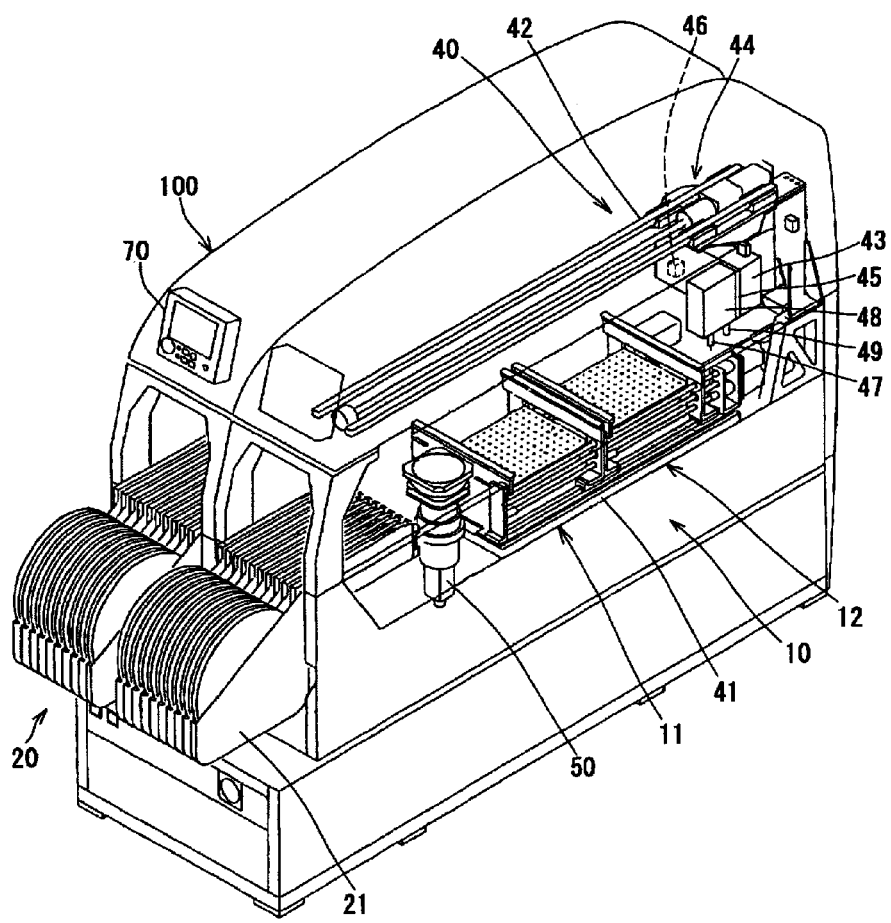
FIG. 4 is a perspective view showing a component mounting machine having a component mounting device to which the reciprocating device according to the present invention is applicable.

The reciprocating device in the preset embodiment is applicable to a component mounting device in a component mounting machine for mounting components on a board which is transferred and positioned. In the following description, the transfer direction of the board will be referred to as X-axis direction, the direction perpendicular to the X-axis direction in the horizontal plane will be referred to as Y-axis direction, and the direction perpendicular to the X-axis direction and the Y-axis direction will be referred to as Z-axis direction. As shown in FIG. 4, the component mounting machine 100 is provided with a component supply device 20 with feeders 21, the component mounting device 40 and a control device 70. In the machine, a plurality (two in FIG. 4) of apparatuses are arranged in series in the X-axis direction, and a board transfer device 10 of the double conveyor type is arranged with two transfer devices 11, 12 juxtaposed in each apparatus.

Figure 5:
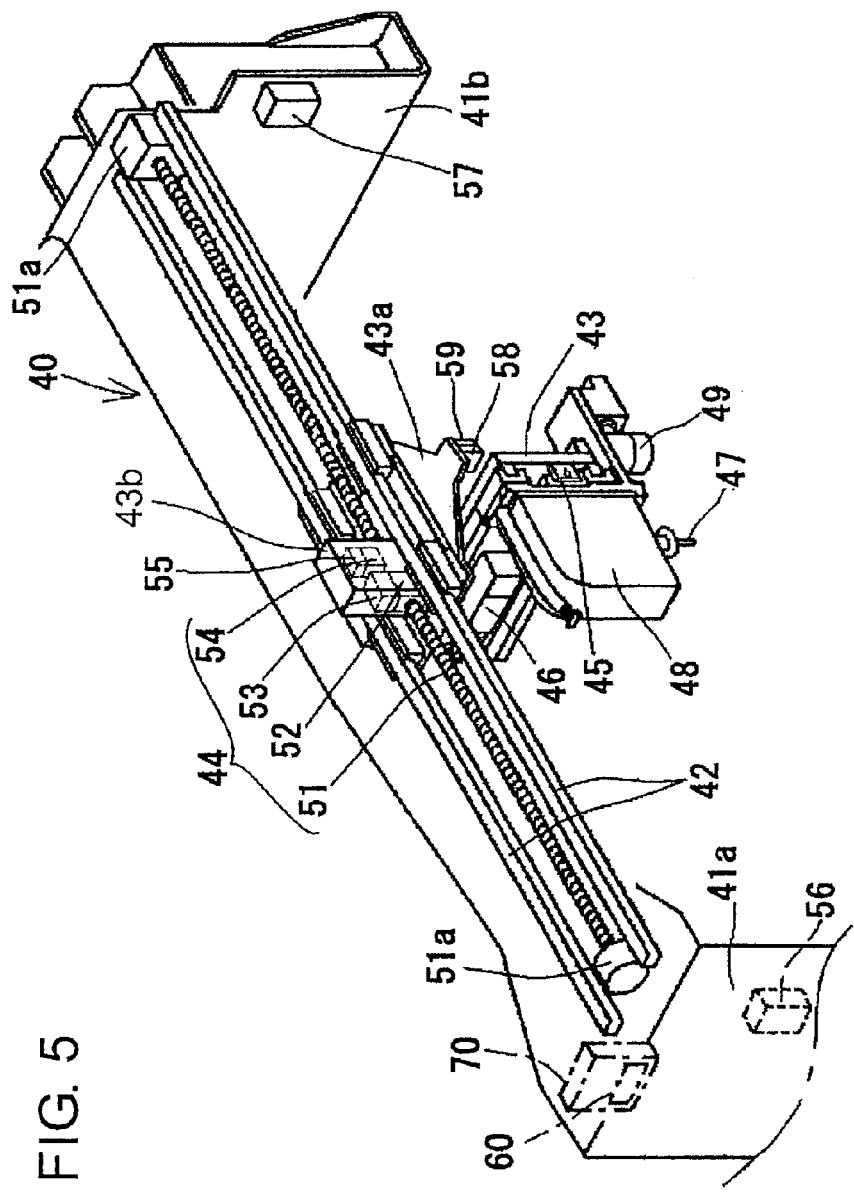
FIG. 5 is a view showing the detailed structure of the component mounting device in FIG. 4.

As shown in FIGS. 4 and 5, the component mounting device 40 is constituted by an X-Y robot, and the X-Y robot is mounted on a base 41 to be arranged over the board transfer device 10 and the component supply device 20. The X-Y robot is provided with a Y-axis slide 43 (corresponding to "movable body" or "slide" in the present invention) being movable in the Y-axis direction along guide rails 42 (corresponding to "track" or "rail" in the present invention) which are fixed at the both ends to fixed walls 41a, 41b to extend in the Y-axis direction. A top plate 43a of the Y-axis slide 43 is arranged slidably along the guide rails 42. The Y-axis slide 43 is moved by a moving device 44 (corresponding to "moving means" in the present invention) along the guide rails 42 in the Y-axis direction.

The moving device 44 is provided with a ball screw 51, a ball nut 52, a gear mechanism 53 and a Y-axis servomotor 54. The ball screw 51 is machined to the almost same length as the guide rails 42, is arranged in parallel to the guide rails 42, and is fixedly supported by support portions 51a at both ends thereof. The ball nut 52 is screw-engaged with the ball screw 51 and is rotatably supported in a housing 43b secured to the top plate 43a of the Y-axis slide 43. The gear mechanism 53 rotationally connects a rotational shaft of the Y-axis servomotor 54 and the ball nut 52 so that the ball nut 52 is rotatable by the driving of the Y-axis servomotor 54 secured to the housing 43b, and is rotatably supported by the housing 43b. Further, a movement control device 55 (corresponding to "movement control means" in the present invention) that drivingly controls the moving device 44 is arranged in the housing 43b.

The moving device 44 is constructed to be drivingly controlled by a wireless power supply through the movement control device 55, for which purpose, there are arranged a first power transmission unit 56, a second power transmission unit 57, a first power receiving unit 58, a second power receiving unit 59, and an electric power control device 60 (corresponding to "electric power control means" in the present invention) built in the control device 70. The first power transmission unit 56 is secured to the fixed wall 41a that fixedly supports one end side (left end side in FIG. 5) of the guide rails 42, and is wired to the electric power control device 60. The first power receiving unit 58 is secured to a lower surface of the top plate 43a on the Y-axis slide 43 to face the first power transmission unit 56 and is wired to the movement control device 55. The second power transmission unit 57 is secured to the fixed wall 41b that fixedly supports the other end side (right end side in FIG. 5) of the guide rails 42, and is wired to the electric power control device 60. The second power receiving unit 59 is secured to the lower surface of the top plate 43a on the Y-axis slide 43 to face the second power transmission unit 57 and is wired to the movement control device 55.

On the Y-axis slide 43, an X-axis slide 45 being a part of a component mounting head 48 is guided movably in the X-axis direction perpendicular to the Y-axis direction. The Y-axis slide 43 is provided with an X-axis servomotor 46, and a ball screw (not shown) rotationally connected to an output shaft of the X-axis servomotor 46 and rotatably supported by the Y-axis slide 43 is screw-engaged with a ball nut secured to the X-axis slide 45, so that the X-axis slide 45 is moved in the X-axis direction. The X-axis slide 45 constitutes a part of the component mounting head 48 (corresponding to "movable body" in the present invention) holding a suction nozzle 47 that is movable in the Z-axis direction in which the suction nozzle 47 attaches components thereto. Further, a board identifying camera 49 is provided on the X-axis slide 45.

The X-axis slide 45 for the component mounting head 48 is short in moving stroke and thus, hardly causes a cable bearer therefor to flutter. Thus, in the present embodiment, a reciprocating device for the component mounting head 48 is constituted as a ball screw mechanism driven by the servomotor that is supplied with electric power by the use of a conventional cable bearer, and does not use the reciprocating device in the present embodiment. However, in the same manner as applied to the Y-axis slide 43, the reciprocating device in the present embodiment may be applied to the reciprocating device that moves the component mounting head 48 being movable in the X-axis direction.

Figure 2:
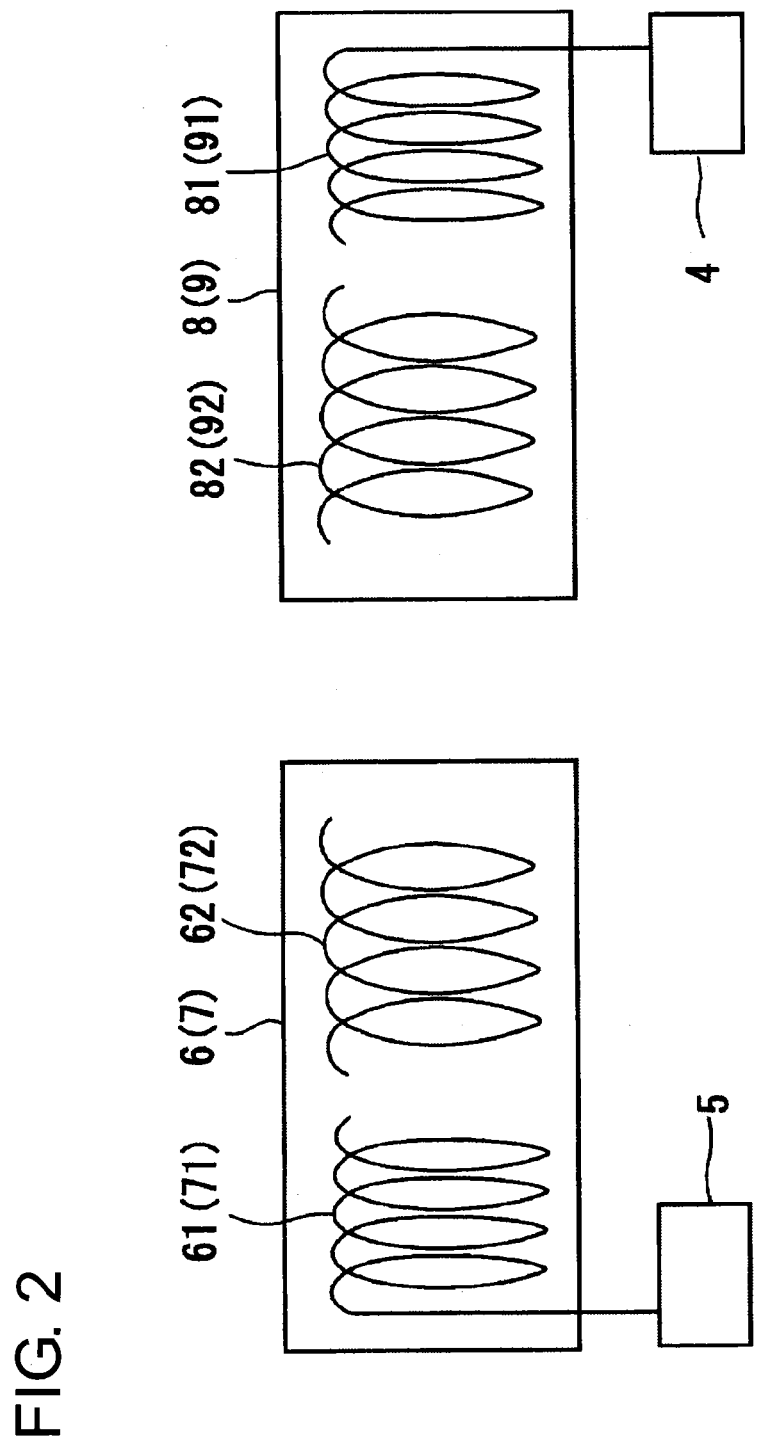
FIG. 2 is a view showing the interior construction of power transmission and receiving units in the reciprocating device in FIG. 1.

The first power transmission unit 56, the second power transmission unit 57, the first power receiving unit 58 and the second power receiving unit 59 are constructed as shown in FIG. 2. By the execution of the control that has been described with reference to FIG. 3, the electric power control device 60 is able to control the power sum of the electric powers to become constant irrespective of changes in the distance between the first power transmission unit 56 and the first power receiving unit 58 and the distance between the second power transmission unit 57 and the second power receiving unit 59. Accordingly, the movement control device 55 is able to reciprocate the Y-axis slide 43 and the component mounting head 48 stably along the guide rails 42.

Particularly, in the component mounting device 40 in the present embodiment, there become unnecessary cables, a cable bearer and the like that are required in prior art component mounting devices for the electric power supply to moving devices such as component mounting head and the like. In the prior art component mounting devices, it may be the case that cables are broken at the time of a high speed movement of the component mounting head or the like, and an energy loss takes place due the loads such as dead load and bending stress of cable bearers. According to the component mounting device 40 in the present embodiment, these problems can be solved because cables and a cable bearer become unnecessary. Further, in the prior art component mounting device, restrictions are imposed on speeding up the component mounting head or the like because an increase in the moving speed of the component mounting head or the like causes the cable bearer to flutter and hence, results in deteriorating the positioning accuracy of the component mounting head as well as in generating errors in operation. According to the component mounting device 40 in the present embodiment, it can be realized to speed up the component mounting head 48 or the like in comparison with the prior art device because the cable bearer for the component mounting device 40 become unnecessary. Further, it can be realized to reduce the space required for the component mounting machine 100 because the cables, the cable bearer and the like become unnecessary.

The moving means 3 for the reciprocating device and the moving device 44 for the component mounting device 40 in the foregoing embodiment have been described taking as example the mechanisms that are provided with the ball screws 31, 51 and the like rotationally driven by the motors 34, 54. However, the construction is not limited to the mechanisms as long as the movable body 2 being reciprocatable along the track 1 and the Y-axis slide 43 (component mounting head 48) being reciprocatable along the guide rails 42 are provided movably. For example, there may be taken constructions that reciprocate the movable body 2 and the Y-axis slide 43 (component mounting head 48) by linear motors.

INDUSTRIAL APPLICABILITY

The reciprocating device is applicable to, for example, a printing device, a detecting device and the like in a board manufacturing system. Further, it is also applicable to machine tools and the like.

DESCRIPTION OF SYMBOLS

1 . . . track, 2 . . . movable body, 3 . . . moving means, 4 . . . movement control means, 5 . . . electric power control means, 6, 56 . . . first power transmission unit, 7, 57 . . . second power transmission unit, 8, 58 . . . first power receiving unit, 9, 59 . . . second power receiving unit, 40 . . . component mounting device, 42 . . . guide rails (track, rail), 43 . . . Y-axis slide (movable body, slide), 44 . . . moving device (moving means), 48 . . . component mounting head (movable body), 55 . . . movement control device (movement control means), 60 . . . electric power control device (electric power control means), 61, 71 . . . primary coil, 62, 72 . . . primary antenna, 81, 91 . . . secondary coil, 82, 92 . . . secondary antenna, 100 . . . component mounting machine

The invention claimed is:

1. A reciprocating device comprising:
   a track;
   a movable body provided reciprocally on the track;
   a moving device that moves the movable body;
   a movement control device that drivingly controls the moving device;
   an electric power control device that controls the output of electric power for movement of the movable body;
   a first power transmission unit connected to the electric power control device and provided on one end side of the track;
   a second power transmission unit connected to the electric power control device and provided on the other end side of the track; and
   a power receiving unit connected to the movement control device and provided on the movable body;
   wherein electric power supplied from the electric power control device to at least one of the first power transmission unit and the second power transmission unit is transmitted wirelessly to the power receiving unit to be received by the power receiving unit and wherein the received electric power is supplied to the movement control device whereby the moving device is drivingly controlled to reciprocate the movable body along the track, and wherein the power receiving unit moves away or toward said at least one of the first power transmission unit and the second power transmission unit when the movable body reciprocates along the track.

2. The reciprocating device in claim 1, wherein the power receiving unit comprises:
   a first power receiving unit being able to receive the electric power transmitted wirelessly from the first power transmission unit; and
   a second power receiving unit being able to receive the electric power transmitted wirelessly from the second power transmission unit and wherein the first power receiving unit moves away from the first power transmission unit, while the second power receiving unit moves toward the second power transmission unit when the movable body moves along the track from said one end side to said other end side of the track and the second power receiving unit moves away from the second power transmission unit, while the first power receiving unit moves toward the first power transmission unit when the movable body moves along the track from said other end side to said one end side of the track.

3. The reciprocating device in claim 2, wherein:
   the first power receiving unit is provided on the movable body to face the first power transmission unit; and
   the second power receiving unit is provided on the movable body to face the second power transmission unit.

4. The reciprocating device in claim 1, wherein the transmission/receiving of the electric power is performed through magnetic field resonance or electric field resonance.

5. The reciprocating device in claim 1, wherein the transmission/receiving of the electric power is performed through electromagnetic induction.

6. The reciprocating device in claim 1, wherein:
   the movable body is at least one of a component mounting head and a slide that mounts the component mounting head movably and that moves the component mounting head, in a component mounting machine for mounting components on a board transferred and positioned; and
   the track is a rail that guides the movement of at least one of the component mounting head and the slide.

7. A reciprocating device comprising:
   a track;
   a movable body provided reciprocally on the track;
   a moving device that moves the movable body,
   a movement control device that drivingly controls the moving device;
   an electric power control device that controls the output of electric power for movement of the movable body;
   a first power transmission unit connected to the electric power device and provided on one end side of the track;
   a second power transmission unit connected to the electric power control device and provided on the other end side of the track; and
   a power receiving unit connected to the movement control device and provided on the movable body;
   wherein electric power supplied from the electric power control device to the first and the second power transmission units is transmitted wirelessly to the first and the second power receiving units to be received by the first and the second power receiving units and wherein the received electric power is supplied to the movement control device whereby the moving device is drivingly controlled to reciprocate the movable body along the track, and wherein the electric power control device controls a power sum of the electric power transmitted and received from the first power transmission unit and the electric power transmitted and received from the second power transmission unit to become constant irrespective of changes in the distance between the first power transmission unit and the power receiving unit and the distance between the second power transmission unit and the power receiving unit.

8. The reciprocating device in claim 7, wherein when the distance between one of the first power transmission unit and the second power transmission unit and the power receiving unit becomes equal to or less than a predetermined value, the electric power control means cuts off the power supply to the other of the first power transmission unit and the second power transmission unit.

* * * * *